United States Patent
Vaucher

[11] Patent Number: 5,216,358
[45] Date of Patent: Jun. 1, 1993

[54] DEVICE FOR TESTING A PRINTED CIRCUIT BOARD

[75] Inventor: Christophe Vaucher, Grenoble, France

[73] Assignee: International Market Development, Cedex, France

[21] Appl. No.: 671,412

[22] Filed: Mar. 20, 1991

[30] Foreign Application Priority Data

Mar. 21, 1990 [FR] France .................. 90 03920

[51] Int. Cl.$^5$ .............. G01R 1/073; G01R 31/02
[52] U.S. Cl. ........................ 324/158 P; 324/158 F
[58] Field of Search .......... 324/158 F, 158 P, 72.5, 324/73.1

[56] References Cited

U.S. PATENT DOCUMENTS 3,654,585  4/1972  Wickersham .............. 324/158 F
4,707,657 11/1987  Boegh-Petersen .......... 324/158 F

FOREIGN PATENT DOCUMENTS 0354080  7/1989  European Pat. Off. .
8427844.6  9/1984  Fed. Rep. of Germany .

OTHER PUBLICATIONS

IBM Technical Disclosure Bulletin, vol. 22, No. 7, Dec. 1979, "Low Force Microcircuit Probe", Gladstein et al.
Publication, "Feinmetall GmbH", Nov. 1987, Herrenberg, DE; Prüfköpfe für den IC-Test.

Primary Examiner—Ernest F. Karlsen
Attorney, Agent, or Firm—Lowe, Price, LeBlanc & Becker

[57] ABSTRACT

A device for testing a printed circuit board (PCB) (30) wherein the connection between the PCB to be tested and the testing circuits of the device is ensured by conductive needles guided by at least one perforated guiding plate (34). The PCB to be tested comprises at least one standard pattern included in a predetermined set of standard patterns of closely spaced contact regions. An intermediate plate (20) has a first surface, turned towards the PCB to be tested, comprising a first pattern of pads arranged according to the standard pattern, and a second surface comprising a second pattern of pads regularly arranged according to a pitch compatible with that of the needles, each pad of the first surface being electrically connected to a pad of the second surface.

15 Claims, 3 Drawing Sheets

DEVICE FOR TESTING A PRINTED CIRCUIT BOARD

BACKGROUND OF THE INVENTION

The present invention relates to a printed circuit board testing device and more particularly to a device for testing printed circuit boards comprising standard repetitive patterns. The invention especially applies to testing printed circuit boards comprising metallized regions adapted to receive integrated circuits connected according to the so-called surface mounting technology (SMT).

Over the last years, for mounting components on printed circuit boards (PCB), the SMT technique is being increasingly used while the insertion mounting technique becomes obsolete. In the insertion technique, each component pin passes through a hole provided in the PCB and wave soldering is achieved on the rear side of the PCB. In surface mounting technique, the component pins are folded so that their extremities are parallel to the mounting plane or tangent to the latter along at least a portion of their length. These folded extremities are laid on metallized regions provided on a PCB and are soldered on the surface, for example by wave soldering.

Among the many known advantages of the SMT, it can be noted that the component pins and the metallized regions on which they are laid can be miniaturized with respect to the case of insertion mounted components.

However, new difficulties regarding the testing of these PCBs before component mounting result from this advantage.

In fact, before mounting components on a PCB, the manufacturer first desires to check for errors in the manufacturing of PCBs. It is essential that this testing of the bare PCB is carefully carried out because, if there is an initial defect in the PCB, there is a risk of wasting all the components that will be subsequently mounted thereon or at least to cause relatively hazardous and expensive disassembly operations.

In order to properly test a PCB, it is necessary that all the metallized regions intended for connecting the components be accessible for equipotential testing.

To couple a testing device and the testing circuits that it incorporates with the metallized regions of a PCB, various means are known, among which the most widely used up to now is a so called "nail bed" connection system. In this system, metallic needles, also called nails, or pins, are pressed against the printed circuit locations to be tested and are provided with a spring system. The needles are generally guided by one or several guiding perforated plates to allow an exact contacting of the locations on the PCB to be tested. The lower guiding plate can be perforated by a digital control system controlled by data generated, for example, by a magnetic tape, corresponding to the data that allowed to determine the positions of the metallized regions on the PCB. Thus, the use of a nail bed implies that the user is equipped with various devices including particularly the nail bed itself, and mechanical and computerized means for perforating the lower guiding plate.

When it is desired to test the PCBs provided for surface mounted components (SMCs), the distance between the pins of the components becomes too small for contacting each contact region directly with one of the needles.

Thus, it is necessary to add on a PCB various test points coupled by connections to each contact region in order to render the spacing compatible with a nail bed.

Such a solution is pernicious because, on the one hand, it complicates the PCB pattern and, on the other hand, it does not allow the testing of the defects existing between the added test points and the contact regions themselves, whereas it is generally the closest-spaced regions of the PCB and therefore the regions that should be tested with greatest care.

SUMMARY OF THE INVENTION

An object of the invention is to solve the access problem encountered for testing structures of standard connection regions, corresponding for example to contact regions of a surface mounted integrated circuit while maintaining, where possible, the known nail bed systems for which numerous users are already equipped.

To solve this problem, the invention provides a device for testing a PCB wherein the connection between the PCB to be tested and the testing circuits is ensured by conductive needles guided by at least one perforated guiding plate, wherein the PCB to be tested comprises at least one standard pattern included in a predetermined set of standard closely-spaced and substantially conductive patterns, comprising at each standard pattern an intermediate plate, a first surface of which, turned towards the PCB to be tested, comprises a first pattern of pads arranged according to said standard pattern, and the second surface of which comprises a second pattern of pads regularly arranged according to a pitch compatible with that of the needles, each pad of the first surface being electrically connected to a pad of the second surface.

According to an embodiment of the invention, the pads and electric connections passing from one surface to the other correspond to conductive material coatings.

According to an embodiment of the invention, each intermediate plate is mounted to a guiding plate arranged near the PCB to be tested.

According to an embodiment of the invention, the guiding plate and the intermediate plate comprise additional positioning means so that the needles passing through the guiding plates abut against the second pattern of pads.

According to an embodiment of the invention, there is provided, as an interface between the first pattern of pads on the intermediate plate and the standard pattern on the PCB, a sheet of an elastic material, depthwise conductive and isolating in the other directions.

According to an embodiment of the invention, several standard intermediate plates are grouped in a single intermediate plate.

BRIEF DESCRIPTION OF THE DRAWINGS

The foregoing and other objects, features and advantages of the invention will be apparent from the following detailed description of preferred embodiments as illustrated in the accompanying figures wherein.

DETAILED DESCRIPTION OF THE INVENTION

Figure 1:
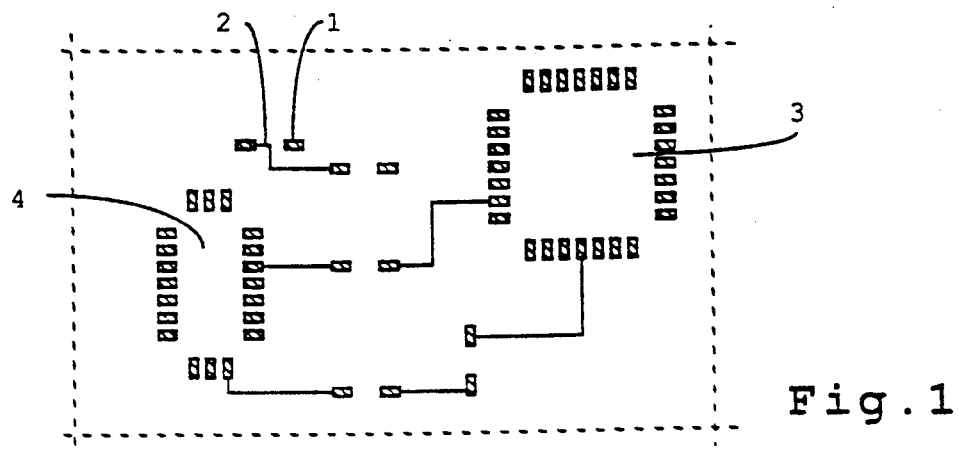
FIG. 1 shows, as an example, a portion of a PCB for SMCs.

FIG. 1 arbitrarily and schematically shows a portion of a PCB. Various contact regions 1 and connections 2 between regions are shown. Two patterns 3 and 4 are provided for receiving SMT integrated circuits. Obviously, connections (not shown) extend from the various contact regions to other contact regions of the PCB or to vias to the other surface or to an intermediate layer of the PCB.

Patterns 3 and 4 for mounting the SMT components (SMTCs) are differentiated by the fact that they include, proximate to a substantially rectangular area, contact regions designed to receive the pins of an integrated circuit. Although there is a large number of types of integrated circuits, their cases and the distribution of the corresponding contact regions are standardized and there is a limited number of case structures. Thus, one of the concepts upon which the invention is based is that, if it is possible to solve the problem of connecting to the contact regions corresponding to standard cases, a problem will have been solved in a way that can be repeated.

Figure 2:
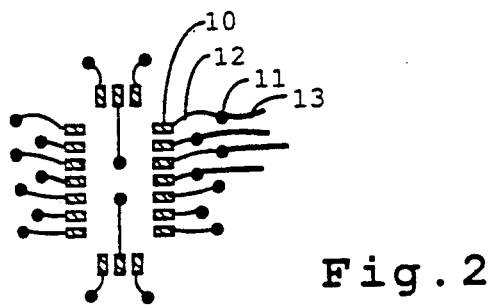
FIG. 2 shows added test points according to the prior art.

FIG. 2 very schematically shows the way the prior art has solved the access problem, through nails of a nail bed, to very closely metallized regions 10, such as the contact regions of a SMC case. A test pad 11 is connected to each contact region through a conductor 12 that can be part of the conductor 13 to which the contact region has to be connected.

FIG. 3A again shows the metallized regions 10 corresponding, for example, to contacts of a SMC.

Figures 3A, 3B, 3C:
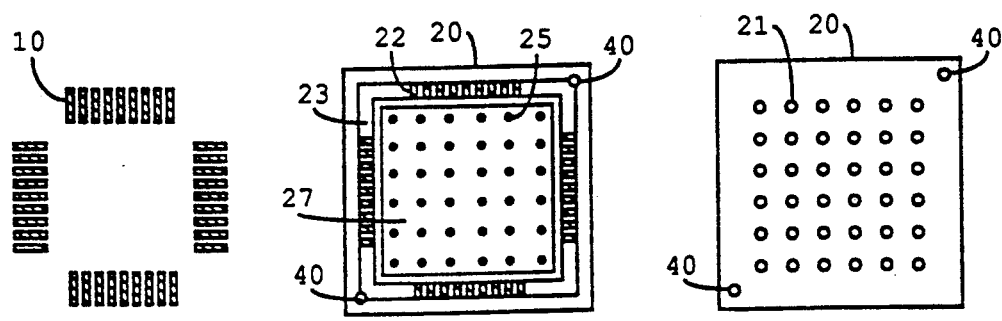
FIGS. 3A, 3B and 3C respectively show a top view of a portion of a PCB, a bottom view of an intermediate plate according to the invention and a top view of an intermediate plate according to the invention.

The invention provides to associate with each set of metallized regions, such as the one illustrated in FIG. 3A, an intermediate structure such as a PCB intermediate plate 20, the lower surface of which, turned towards the PCB to be tested, is shown in FIG. 3B and the upper surface of which, turned towards the needles, is shown in FIG. 3C.

The upper face of the intermediate plate carries a set of contact pads 21 arranged according to a pitch corresponding to that of the needles. The lower face comprises contact pads 22 arranged according to the same pattern as the metallized regions 10 and designed to abut against the latter by means of a sheet or strips 23 of an anisotropically conductive elastic material, that is, depthwise conductive but not conductive in the other directions. Such a material is known per se and it has even been tried in the prior art to use it as a full test interface for a PCB. However, this has led to complex and expensive solutions, not easily compatible with industrial applications.

The PCB intermediate plate 20 comprises means for connecting the contact regions 22 on the lower surface to the contact pads 21 on the upper surface. This can be achieved by vias 25 schematically represented in FIG. 3B, each of which is coupled by a connection (not shown) to one of pads 22. It is also possible to provide a multilayer PCB intermediate plate, the connections between a surface and the other being achieved by partial vias and conductors in the intermediate layer. Preferably, a sheet 27 of an insulating material arranged inside a frame of anisotropically conductive material 23 will be provided.

An advantage of the invention is that, as indicated above, since the arrangement of the pins of the SMCs is standardized, it will be sufficient to prepare sets of intermediate plates corresponding to standard sizes to subsequently mount them on the lower guiding plate of a nail bed connection system.

Figure 4:
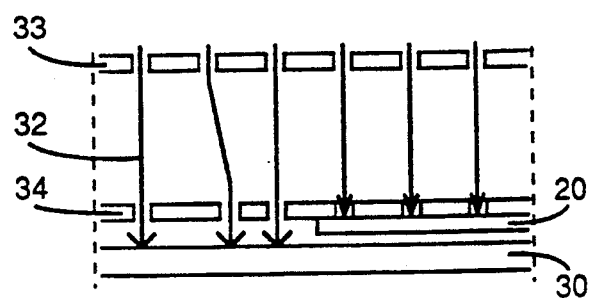
FIG. 4 shows a schematic simplified view of the mounting of an intermediate plate according to the invention.

This is schematically illustrated in FIG. 4 which shows an intermediate plate 20 arranged on top of a PCB 30 to be tested as well as a nail bed system comprising needles 32 guided by guiding plates 33 and 34, the guiding plate 34 being proximate to the PCB surface to be tested. As shown in the figure, some of the needles (on the right in the figure) abut against the upper contact pads 21 of intermediate plate 20 while the other needles (on the left in the figure) directly contact the metallized regions of the PCB to be tested.

Figure 5:
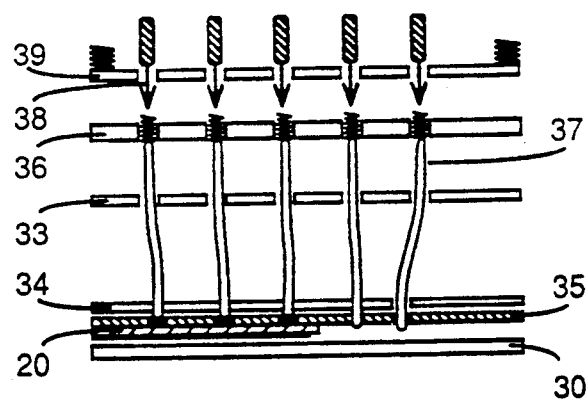
FIG. 5 shows in more detail, although still schematically, the mounting of an intermediate plate according to the invention.

FIG. 5 shows in more detail an embodiment of the system according to the invention. The figure shows a PCB 30 to be tested, an intermediate plate 20 according to the invention, guiding plates 33 and 34, an additional guiding plate 35 designed to mount the intermediate plates 20, a plate 36 with spring-mounted connection needles 37 in turn pushed by pins 38 mounted on a plate 39.

In the above, the words "lower" and "upper" are relative. In fact, it will be possible to carry out a simultaneous test of the upper and lower surfaces of a PCB.

The mounting of the intermediate plates pre-fabricated according to the invention to the guiding plate 34 (FIG. 4) or to the additional plate 35 (FIG. 5), can be achieved by any appropriate means, for example by adhesive bonding.

Referring back to FIGS. 3B and 3C, it will be noted that it is possible to provide holes or positioning pins 40 on the intermediate plates 20, complementary means being provided on the lower plate 34 or 35.

Thus, a user desiring to test a PCB will be able to use a conventional nail bed arrangement. He will provide the lower guiding plate 33 with holes at the positions corresponding to the regions he desires to directly contact on the PCB. Concerning the portions of the PCB where SMCs are mounted, he will use pre-fabricated intermediate plates according to the invention that he will simply have to glue on the lower guiding plate which will then include an array of regular holes and, eventually, positioning means. This can be achieved by very slightly modifying a contacting system using a conventional nail bed.

Those skilled in the art will be able to bring various changes to the invention, especially concerning the choice of the materials, for adapting the invention to specific nail bed systems.

For example, the anisotropically conductive elastic material can be made of a polymer such as the MAF product available from the Japanese company SHIN ETSU, this material having a thickness of about 200 $\mu$m, the isolating sheet 27 liable to be a Kapton sheet having a thickness of about 80-90% of that of the polymer.

The intermediate plates 20 can be achieved from one or several isolating non-rigid or rigid plates, wherein holes are made which are subsequently filled with a conductive material, for example a conductive resin, and from which will be formed conductive connections extending to couple an upper pad with a lower pad. If the lower pads are made of an elastic conductive material, it will be possible to avoid using the above anisotropically conductive elastic material.

Moreover, it is possible to assemble in a single intermediate plate several intermediate plates according to the invention.

Thus, with the provision of pre-fabricated standard intermediate plates corresponding to standard patterns such as contact regions of SMT integrated circuits the invention allows the full testing of PCBs in a simple and not expensive way. Moreover, since the patterns of contact regions of the SMT integrated circuits correspond to standards, only a limited number of pre-fabricated intermediate plates has to be stocked, as above indicated.

According to an aspect of the invention, further standardization is provided by manufacturing each PCB from an assembly of strips.

These strips comprise, on a first face, aligned conductive regions spaced according to the pitch of the conductive regions of the standard patterns to be tested and, on their second face, contact pads spaced according to a pitch compatible with that of the nails of a nail bed device, each of these pads being connected to a conductive region. Indeed, considering the various standard patterns of contact regions corresponding, for example, to contact patterns of SMT integrated circuits, there is a small number of standard pitches between contacts. The various standard patterns differ one from the other essentially in the number of contact regions along each side of a rectangular outline. Thus, instead of manufacturing standard intermediate plates, it will be sufficient to manufacture standard strips according to the various standardized pitches, to cut these strips and then to assemble them according to a determined standard pattern.

Figure 6:
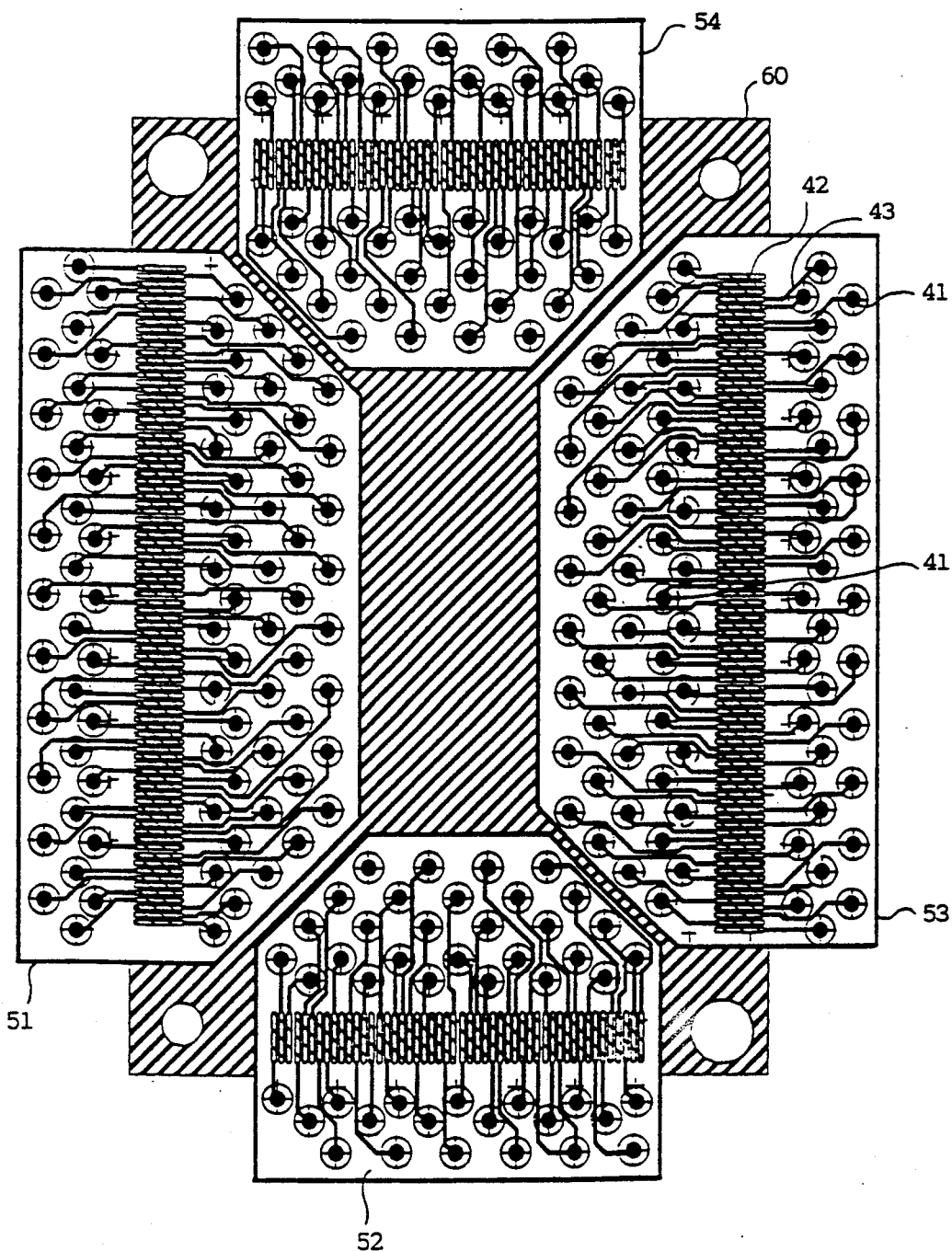
FIG. 6 is a bottom view of an embodiment of an intermediate plate according to the invention.

An example of such an implementation is illustrated in FIG. 6, this figure being a bottom view, as FIG. 3B. The contact regions 42 for contacting the conductive regions of a printed circuit in the above described way are connected by conductors 43 to pads 41 arranged on the strip on both sides of the contact regions 42 according to a regular pattern so that a long size strip can be cut away at a determined length corresponding to a given circuit. In FIG. 6, four strips or strip portions 51, 52, 53, 54 are mounted on a supporting plate 60. This supporting plate 60 can be mounted on a plate 34 or 35 of a nail bed device in the same way as the intermediate plate 20 of FIG. 5.

Obviously, the supporting plate 60 must have vias or contacts facing each strip pad 41.

Each strip can be formed by a portion of the PCB and the supporting plate 60 can be of epoxy resin.

Figure 7:
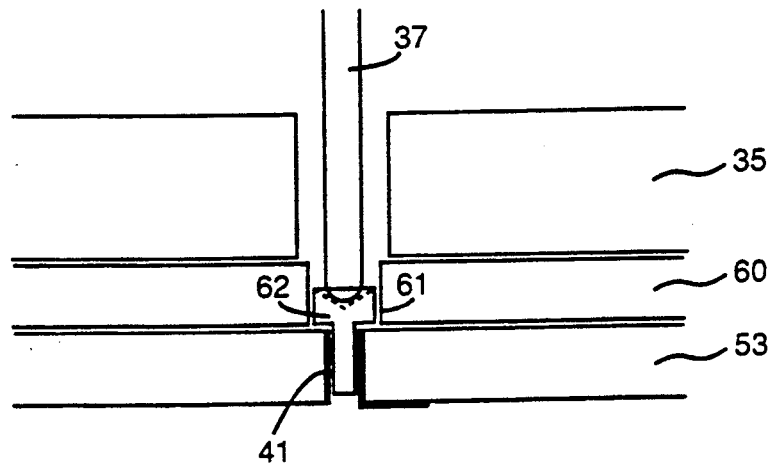
FIG. 7 is a partial section view corresponding to the embodiment of FIG. 6.

An example of a preferred embodiment for assembling a strip 53 with a supporting plate 60, in turn integral with a lower plate 35 of a nail bed device, is illustrated in the partial section view of FIG. 7. This section view is taken at a contact pad 41.

In the shown embodiment, the contact pad 41 is in fact constituted by a metallized via formed in strip 53. The supporting plate 60 facing each metallized via 41 comprises an aperture 61. A cylindric-shaped metal peg 62, the lower portion of which has an inner diameter equal to that of the metallized via 41 (or a smaller diameter with a projecting flange) and a head portion of which has an inner diameter substantially equal to that of the aperture 61, is mounted as illustrated in FIG. 6 and ensures relative positioning of strips 53 and supporting plate 60, and blocks them. The peg 62 also acts as a contact transfer element, its head comprising a cone shaped cut for receiving the extremity of a needle 37 of the nail bed device. This particularly simple system allows to use strips 53 over a long period of time without causing overwear.

By way of practical example, it will be noted that the plate 35, for example of plexiglass, may have a thickness of about 10 mm, the supporting plate 60 a thickness of 0.8-1.6 mm and the strip 53 a thickness of 0.8 mm.

I claim:

1. In a nail bed device for testing a printed circuit board (PCB), the nail bed device including a plurality of needles for contacting metallized contact regions of the PCB, the improvement comprising:
    an intermediate plate positioned between a predetermined number of said needles and the PCB, said intermediate plate including:
        a first number of first contact pads on a first surface facing said plurality of needles, said first contact pads contacting a first number of said needles,
        a plurality of second contact pads on a second surface opposite to said first surface and facing said metallized contact regions of the PCB, said second contact pads patterned to match said contact regions of the PCB, and
        a plurality of vias through said intermediate plate for connecting said first and second contact pads,
        wherein said predetermined number of said needles is less than the number of said plurality of needles of the nail bed device,
    the nail bed device including a second number of said needles directly contacting metallized contact regions of the PCB.

2. A testing device according to claim 1, wherein said first and second conductive pads and said needles are positioned in correspondence to conductive coatings.

3. A testing device according to claim 1, wherein said intermediate plate is mounted to a guiding plate adjacent said first surface, said predetermined number of needles passing through said intermediate plate.

4. A testing device according to claim 3, wherein said guiding plate and said intermediate plate comprise additional positioning means for positioning said predetermined number of needles passing through said guiding plate against said first contact pads.

5. A testing device according to claim 1, further including an interface between said second surface of said intermediate plate and the contact regions of the PCB, said interface comprising a sheet (23) of an elastic material, said sheet being conductive in a depthwise direction and substantially isolating in other directions.

6. A testing device according to claim 5, wherein the contact regions of the PCB correspond to metallized regions for connecting a surface mounted component (SMC).

7. A testing device according to claim 6, wherein said sheet of depthwise conductive elastic material is arranged in strips overlapping only the contact regions of the PCB at a peripheral areas of said intermediate plate, and wherein a central area of the second surface of the intermediate plate includes a coating of an isolating film

(27) thinner than said sheet of depthwise conductive elastic material.

8. A testing device according to claim 1, wherein said PCB comprises a supporting plate and a plurality of strips mounted thereon, each strip including metallized contact regions thereon.

9. A testing device according to claim 1, wherein the metallized contact regions of the PCB are arranged in a plurality of standard patterns, the testing device including a plurality of intermediate plates respectively corresponding to said plurality of standard patterns.

10. A testing device according to claim 9, wherein each of said plurality of intermediate plates is mounted to a guiding plate adjacent said first surface, said predetermined number of needles passing through said intermediate plate.

11. A testing device according to claim 10, wherein said guiding plate and said intermediate plates comprise additional positioning means for positioning said predetermined number of needles passing through said guiding plate against said first contact pads.

12. A testing device according to claim 9, further including an interface between said second surface of said intermediate plates and the contact regions of the PCB, said interface comprising a sheet (23) of an elastic material, said sheet being conductive in a depthwise direction and substantially isolating in other directions.

13. A testing device according to claim 12, wherein said the contact regions of the PCB correspond to metallized regions for connecting a surface mounted component (SMC).

14. A testing device according to claim 13, wherein said sheet of depthwise conductive elastic material is arranged in strips overlapping only the contact regions of the PCB at peripheral areas of said intermediate plates, and wherein a central area of the second surface of the intermediate plates includes a coating of an isolating film (27) thinner than said sheet of depthwise conductive elastic material.

15. A testing device according to claim 9, wherein said PCB comprises a supporting plate and a plurality of strips mounted thereon, each strip including metallized contact regions thereon.

* * * * *